(12) United States Patent
Hernandez Serna et al.

(10) Patent No.: US 11,967,975 B1
(45) Date of Patent: Apr. 23, 2024

(54) METHOD AND APPARATUS FOR RECURSIVE DATA COMPRESSION USING SEED BITS

(71) Applicants: Eduin Esteban Hernandez Serna, Arlington, VA (US); Walter Andres Hernandez Serna, Arlington, VA (US)

(72) Inventors: Eduin Esteban Hernandez Serna, Arlington, VA (US); Walter Andres Hernandez Serna, Arlington, VA (US)

(*) Notice: Subject to any disclaimer, the term of this patent is extended or adjusted under 35 U.S.C. 154(b) by 153 days.

(21) Appl. No.: 17/857,340

(22) Filed: Jul. 5, 2022

Related U.S. Application Data (60) Provisional application No. 63/288,324, filed on Dec. 10, 2021.

(51) Int. Cl.
| H03M 7/00 | (2006.01) |
| H03M 7/30 | (2006.01) |
| H03M 7/40 | (2006.01) |

(52) U.S. Cl.
CPC ........... H03M 7/40 (2013.01); H03M 7/6011 (2013.01)

(58) Field of Classification Search
CPC .............................. H03M 7/40; H03M 7/6011
USPC ............................................ 341/50, 51, 106
See application file for complete search history.

(56) References Cited

U.S. PATENT DOCUMENTS

| 5,260,693 | A | 11/1993 | Horsley |
| 5,488,364 | A | 1/1996 | Cole |
| 7,412,104 | B2 | 8/2008 | Talapov |
| 7,424,163 | B1 | 9/2008 | Ellis et al. |
| 7,502,514 | B2 | 3/2009 | Gringeler et al. |
| 8,194,736 | B2 | 6/2012 | Youn |
| 9,176,973 | B1 | 11/2015 | Allison et al. |
| 9,514,149 | B2 | 12/2016 | Ackerman et al. |
| 10,382,769 | B2 | 8/2019 | Schneider |
| 10,733,765 | B2 | 8/2020 | Andreev |
| 11,677,416 | B2 * | 6/2023 | Secareanu ........... H03M 7/6005 341/50 |
| 2004/0199740 | A1 | 10/2004 | Makela et al. |
| 2008/0212130 | A1 | 9/2008 | Jung |

* cited by examiner

*Primary Examiner* — Peguy Jean Pierre
(74) *Attorney, Agent, or Firm* — John Rizvi; John Rizvi, P.A.—The Patent Professor®

(57) ABSTRACT

A method and apparatus that facilitates lossless data compression employing seed bits and recursive processing. The compression steps operate on the initial binary representation of the input digital data stream by representing the digital data stream using two data sets namely a rule data set and a seed data set, wherein the rules data is a dictionary, and the seed data is a unique binary string defined in the course of the recursive processing having a size that is less than the original data string.

20 Claims, 5 Drawing Sheets

METHOD AND APPARATUS FOR RECURSIVE DATA COMPRESSION USING SEED BITS

CROSS-REFERENCE TO RELATED APPLICATION

This application claims the benefit of U.S. Provisional Application 63/288,324, filed Dec. 10, 2021, which is hereby incorporated by reference herein in its entirety.

FIELD OF THE INVENTION

The present invention relates generally to data compression and decompression, and more particularly, to a lossless data compression/decompression technique employing seed bits and recursive processing.

BACKGROUND OF THE INVENTION

Conventional data compression techniques and systems encode a stream of digital data into a compressed code stream and decode the compressed code stream back into a corresponding original data stream. Data compression is an important technique that allows for the transmission of large data sets (e.g., video, audio and/or text). The code stream is referred to as "compressed" because the stream typically consists of a smaller number of codes than symbols contained in the original data stream. Such smaller codes can be advantageously stored in a corresponding smaller amount of memory than the original data. Further, the compressed code stream can be transmitted in a communications system, e.g., a wired, wireless, or optical fiber communications system, in a corresponding shorter period of time than the uncompressed original data. The demand for data transmission and storage capacity in today's communications networks and streaming services platforms, as required by the significant increase in content exchanges across such networks and platforms, is ever-increasing. Thus, data compression plays an integral role in most modem transmission protocols and communications networks. As is well-known, two classes of compression techniques useful in the compression of data are so-called special purpose compression and general purpose compression. Special purpose compression techniques are designed for compressing special types of data and are often relatively inexpensive to implement. For example, well-known special purpose compression techniques include run-length encoding, zero-suppression encoding, null-compression encoding, and pattern substitution. These techniques generally have relatively small compression ratios due to the fact that they compress data which typically possesses common characteristics and redundancies. As will be appreciated, a compression ratio is the measure of the length of the compressed codes relative to the length of the original data. However, special purpose compression techniques tend to be ineffective at compressing data of a more general nature, i.e., data that does not possess a high degree of common characteristics and the like.

In contrast, general purpose compression techniques are not designed for specifically compressing one type of data and are often adapted to different types of data during the actual compression process. Some of the most well-known and useful general purpose compression techniques emanate from a family of algorithms developed by, J. Ziv and A. Lempel, and commonly referred to in the art as "Lempel-Ziv coding" In particular, Ziv et al., "A Universal Algorithm for Sequential Data Compression", *IEEE Transactions on Information Theory*, IT-23(3):337-343, May 1977 (describing the commonly denominated "LZ1" algorithm), and Ziv et al., "Compression of Individual Sequences Via Variable-Rate Coding", *IEEE transactions on Information Technology*, IT-24(5):530-536, September 1978 (describing the commonly denominated "LZ2" algorithm), which are each hereby incorporated by reference for all purposes. The LZ1 and LZ2 data compression schemes (also known as LZ77 and LZ78) are well-known in the art and need not be discussed in great detail herein.

Most compression algorithms focus on removing entropy (repeated or similar data fragments) from the original data. Numerous compression technologies based on this scheme are widely known and used in the art. They include the use of dictionaries, tables of previously encountered data, and partial matches of previous data. Hashes of the previous data have been used to improve efficacy of compression technologies, and multithreaded engines have been used to decrease the time required to compress the datasets. Further, technologies for compression of electronic data may be divided in two broad categories: lossy and lossless. Lossy compression inevitably introduces a degree of degradation to the original data meaning that an exact replica of the original data cannot be recovered after the original data is compressed. Although lossy compression can be quite beneficial for some uses, degradation of original data is a major drawback that renders lossy compression ineffective for many applications.

Lossless compression, on the other hand, permits the original electronic data to be compressed and decompressed without any degradation. A number of lossless compression algorithms are known in the art. Most rely on run-length encoding, or a modified version thereof, to exploit redundancy in the electronic data. During compression, the blocks of data having a particular value are substituted with a smaller number of key bytes, thus reducing the size of the data. The key bytes contain both the value of the byte and the number of bytes in the run. The key bytes dictate the number of times the data byte value must be expanded or duplicated to obtain the original data from the compressed data. In this way, lossless compression algorithms allow for the original data to be perfectly reconstructed from the compressed data. By contrast, lossy compression permits reconstruction only of an approximation of the original data, though usually with greatly improved compression rates (and therefore reduced media sizes). Lossless compression is used in cases where it is important that the original and the decompressed data be identical, or where deviations from the original data would not be desired. Typical examples are executable programs, text documents, and source code. Some image file formats, like Portable Network Graphics (PNG) or Graphical Interchange Format (GIF), use only lossless compression, while others like Tagged Image File Format (TIFF) may use either lossless or lossy methods. Lossless audio formats are most often used for archiving or production purposes, while smaller lossy audio files are typically used on portable players and in other cases where storage space is limited or exact replication of the audio is unnecessary. Most lossless compression programs perform a first step that generates a statistical model for the input data, and the second step uses this model to map input data to bit sequences in such a way that "probable" (e.g., frequently encountered) data will produce shorter output than "improbable" data.

Two well-known lossless compression techniques are Huffman coding and the aforementioned Lempel-Ziv coding. The primary encoding algorithms used to produce bit sequences are Huffman coding and arithmetic coding. The output from Huffman's algorithm can be viewed as a variable-length code table for encoding a source symbol (such as a character in a file). Huffman coding uses a specific method for choosing the representation for each symbol, resulting in a prefix code (sometimes called "prefix-free codes", that is, the bit string representing some particular symbol is never a prefix of the bit string representing any other symbol). Huffman coding is such a widespread method for creating prefix codes that the term "Huffman code" is widely used as a synonym for "prefix code" even when such a code is not produced by Huffman's algorithm. The algorithm derives this table from the estimated probability or frequency of occurrence (weight) for each possible value of the source symbol. As in other entropy encoding methods, more common symbols are generally represented using fewer bits than less common symbols. Huffman's method can be efficiently implemented, finding a code in time linear to the number of input weights if these weights are sorted. Arithmetic coding achieves compression rates close to the best possible for a particular statistical model, which is given by the information entropy, whereas Huffman compression is simpler and faster but produces poor results for models that deal with symbol probabilities close to 1.

There are a variety of Lempel-Ziv implementations that have their genesis in the aforementioned LZ77 and LZ78 algorithms. LZ77 algorithms achieve compression by replacing repeated occurrences of data with references to a single copy of that data existing earlier in the uncompressed data stream. A match is encoded by a pair of numbers called a length-distance pair, which is equivalent to the statement "each of the next length characters is equal to the characters exactly distance characters behind it in the uncompressed stream" (the distance is sometimes called the offset instead). LZ78 algorithms achieve compression by replacing repeated occurrences of data with references to a dictionary that is built based on the input data stream. Each dictionary entry is of the form dictionary[ . . . ]={index, character}, where index is the index to a previous dictionary entry, and character is appended to the string represented by dictionary [index]. For example, "abc" would be stored (in reverse order) as follows: dictionary[k]={j, 'c'}, dictionary[j]={i, 'b'}, dictionary[i]={0, 'a'}, where an index of 0 specifies the first character of a string. The algorithm initializes last matching index=0 and next available index=1. For each character of the input stream, the dictionary is searched for a match: {last matching index, character}. If a match is found, then last matching index is set to the index of the matching entry, and nothing is output. If a match is not found, then a new dictionary entry is created: dictionary [next available index]={last matching index, character}, and the algorithm outputs last matching index, followed by character, then resets last matching index=0 and increments next available index. Once the dictionary is full, no more entries are added. When the end of the input stream is reached, the algorithm outputs last matching index. Note that strings are stored in the dictionary in reverse order, which an LZ78 decoder will have to operate with accordingly. The Lempel-Ziv-Welch (LZW) algorithm is an LZ78-based algorithm that uses a dictionary pre-initialized with all possible characters (symbols) or emulation of a pre-initialized dictionary. The main improvement of LZW is that when a match is not found, the current input stream character is assumed to be the first character of an existing string in the dictionary (since the dictionary is initialized with all possible characters), so only the last matching index is output (which may be the pre-initialized dictionary index corresponding to the previous (or the initial) input character).

Also, lossless compression methods may be categorized according to the type of data they are designed to compress. While, in principle, any general-purpose lossless compression algorithm (general-purpose meaning that they can accept any bitstring) can be used on any type of data, many are unable to achieve significant compression on data that are not of the form for which they were designed to compress. Many of the lossless compression techniques used for text also work reasonably well for indexed images. Given today's communications mechanisms and the pervasive use of content streaming, the need for transmitting larger and larger data sets over available bandwidth channels continues to increase. As such, there is continuous need for improved data compression techniques that transmit large data sets efficiently and without major data loss of any kind.

Accordingly, there is need for an improved lossless data compression/decompression technique for transmitting large data sets efficiently and without major data loss of any kind.

SUMMARY OF THE INVENTION

The present invention is directed to a method and apparatus that facilitates lossless data compression/decompression employing seed bits and recursive processing.

In a first implementation of the invention, a method is provided for lossless data compression employing seed bits and recursive processing, the method comprising: (a) receiving a digital data stream; (ii) producing a bit string comprising a plurality of bits from the digital data stream received; (iii) designating a bit position for each respective bit of the plurality of bits; and (iv) recursively traversing the plurality of bits of the bit string as a function of the bit position designated for each respective bit of the plurality of bits and identifying one or more sets of uniquely adjacent bits and defining a rule (Rule_N) therefrom, defining a seed (String_Binary_N+1) from the balance of the non-uniquely adjacent Bits, and storing the Rule_N and Seed (String_Binary_N+1); and (v) outputting a compressed file comprising a plurality of rules (Rule_0 . . . Rule_N) and the final seed defined (String_Binary_N+1) from the plurality of seeds defined. In this way, the compression steps operate on the initial binary representation of the input digital data stream by representing the digital data stream using two data sets namely a rule data set and a seed data set, wherein the rules data is a dictionary, and the seed data is a unique binary string (i.e., String_Binary) having a size that is less than the original data string.

In a second implementation of the invention, an apparatus is provided for lossless data compression employing seed bits and recursive processing. The apparatus comprising: at least processor and a memory storing instructions that when executed cause the processor to perform operations comprising: (a) receiving a digital data stream; (ii) producing a bit string comprising a plurality of bits from the digital data stream received; (iii) designating a bit position for each respective bit of the plurality of bits; and (iv) recursively traversing the plurality of bits of the bit string as a function of the bit position designated for each respective bit of the plurality of bits and identifying one or more sets of uniquely adjacent bits and defining a rule (Rule_N) therefrom, defining a seed (String_Binary_N+1) from the balance of the non-uniquely adjacent Bits, and storing the Rule_N and Seed (String_Binary_N+1); and (v) outputting a compressed file comprising a plurality of rules (Rule_0 . . . Rule_N) and the final seed defined (String_Binary_N+1) from the plurality of seeds defined. In this way, the compression steps operate on the initial binary representation of the input digital data stream by representing the digital data stream using two data sets namely a rule data set and a seed data set, wherein the rules data is a dictionary, and the seed data is a unique binary string (i.e., String_Binary) having a size that is less than the original data string.

In a third aspect, a method is provided for lossless data decompression employing seed bits and recursive processing, the method comprising: (i) receiving a compressed digital data stream in accordance with the aforementioned compression operations; (ii) parsing and retrieving Rule_N (i.e., the final rule of a plurality of rules generated during the compression operations) and String_Binary_N+1 (i.e., the final seed string of a plurality of seed strings generated during the compression operations); (iii) recursively applying Rule_N−1 with String_Binary_N to produce String_Binary_N−1 and outputting output String_Binary_0 (i.e., the initial binary string); (iv) converting the bit stream to generate the original digital data stream received; and (v) outputting the original digital data stream.

In another aspect, an apparatus is provided for lossless data decompression employing seed bits and recursive processing. The apparatus comprising: at least processor and a memory storing instructions that when executed cause the processor to perform operations comprising: (i) receiving a compressed digital data stream in accordance with the aforementioned compression operations; (ii) parsing and retrieving Rule_N (i.e., the final rule of a plurality of rules generated during the compression operations) and String_Binary_N+1 (i.e., the final seed string of a plurality of seed strings generated during the compression operations); (iii) recursively applying Rule_n−1 with String_Binary_N to Produce String_Binary_N−1 and outputting output String_Binary_0 (i.e., the initial binary string); (iv) converting the bit stream to generate the original digital data stream received; and (v) outputting the original digital data stream.

In another aspect the digital data stream is any type of digital format.

In another aspect the input digital data stream size is of any size, and the resultant compression thereof is in a range greater than or equal to seventy-five percent (75%) and less than one hundred percent (100%).

In another aspect, the data stream received is a digital stream comprising a digital format associated with at least one of: still image files, audio files, digital video data, motion picture files, geospatial data, qualitative data, digital binary data (BD), a six (6) degrees of freedom digital model, digital Internet-of-Things (IoT), documentation and scripts, chemistry data, quantitative tabular data with metadata, video data streams, an audio data streams, and a textual data streams.

In another aspect, the compression cycle is defined using one of a compression ratio, a threshold, and a sensitivity designation.

In another aspect, the initial bit string and each of the new bit strings defined are represented by a data structure comprising a respective one rule of the plurality of rules in combination with a respective one seed string of the plurality of seed strings.

In another aspect, the plurality of rules serve as a dictionary comprising a set of strings in the data structure, and each seed string of the plurality of seed strings is a unique binary bit string having a size that is less than the initial binary bit string.

In another aspect, the data structure form is defined as a function of a number of equal adjacent bits and a position of first adjacent bits.

In another aspect, the data stream received is transmitted using a medium comprising one of a wired transmission medium, a wireless transmission medium and an optical transmission medium.

In another aspect, the data stream received is of a variable size.

In another aspect, the data stream received is equal to one (1) terabyte of data.

These and other objects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, where like designations denote like elements, and in which.

Like reference numerals refer to like parts throughout the several views of the drawings.

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 1:
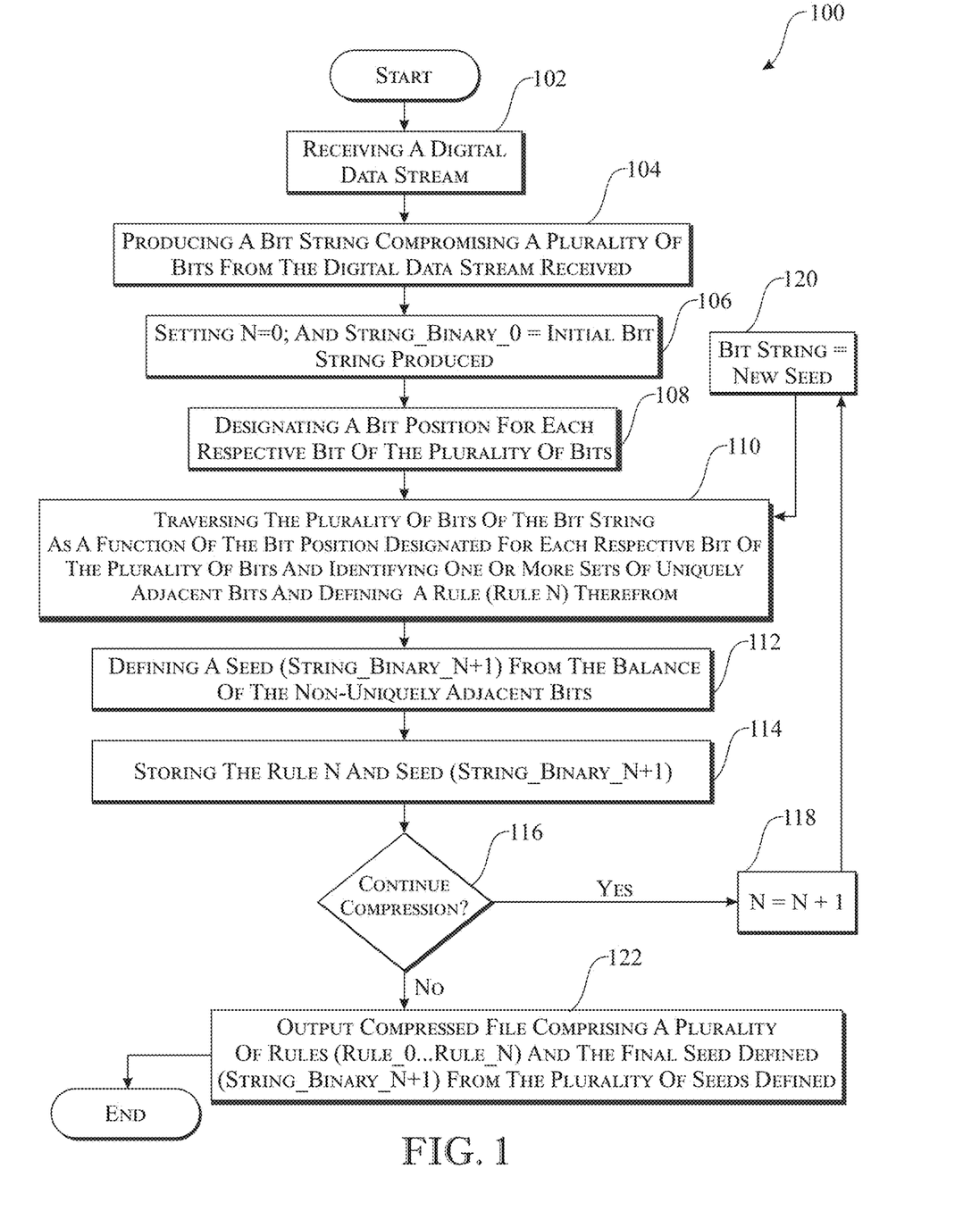
FIG. 1 presents a flowchart of illustrative operations for compressing data in accordance with an embodiment.

As shown throughout the figures, the present invention is directed to a method and apparatus that facilitates lossless data compression/decompression employing seed bits and recursive processing. Turning our attention to FIG. 1, a flowchart of illustrative operations 100 is shown for compressing data in accordance with an embodiment. More particularly, at step 102, receiving a digital data stream. Illustratively, the digital stream may be any type of digital format including but not limited to, still image files, audio files, digital video data, motion picture files, geospatial data, qualitative data, digital binary data (BD), digital 6 DOF (i.e., a six (6) degrees of freedom (DOF) digital model), digital Internet-of-Things (IoT), documentation and scripts, chemistry data, quantitative tabular data with extensive metadata or minimal metadata, video data stream, an audio data stream, and/or a textual data stream as communicated by and over various types of transmission mediums including, but not limited to, wired, wireless or optical mediums. Further, the compression/decompression operations disclosed herein may be alternatively useful for recording information to, and reading information from, a magnetic medium such computer disk drives, optical-readable mediums and/or other digital data storage mediums and the like. At step 104, producing a bit string comprising a plurality of bits from the digital data stream received. The bit string may be produced using well-known bit conversion techniques that operate on the incoming source data stream (e.g., a video stream) and convert such incoming source data stream into a bit stream comprising a plurality of bits. Then, at steps 106 and 108, setting n=0 and String_Binary_0 as the initial bit string, and designating a bit position for each respective bit of the plurality of bits. The following Table 1 is an example bit stream "00110011100" generated and operated on in accordance with the encoding operations of FIG. 1:

|  | Designated Bit Position | | | | | | | | | | |
| --- | --- | --- | --- | --- | --- | --- | --- | --- | --- | --- | --- |
|  | 1 | 2 | 3 | 4 | 5 | 6 | 7 | 8 | 9 | 10 | 11 |
| Bit Stream (String_Binary) | 0 | 0 | 1 | 1 | 0 | 0 | 1 | 1 | 1 | 0 | 0 |

In accordance with the principles of the disclosed embodiments herein, this binary representation (i.e., String_Binary) is further represented by two data sets, namely a "rules" data set and a "seed" data set. The rules data set is a dictionary which is a well understood dictionary coder (also sometimes known as a substitution coder) employed in a class of lossless data compression algorithms which operate by searching for matches between the text to be compressed and a set of strings contained in a data structure (i.e., called the "dictionary") maintained by the encoder. When the encoder finds such a match, it substitutes a reference to the string's position in the data structure. In terms of the illustrative bit stream of Table 1 the structure to be constructed will be in accordance with the number of equal adjacent bits (e.g., 00 or 111) and the position of the first adjacent bit. This structure therefore is given by the equation (A):

$$\text{Structure} = (\text{number of equal adjacent bits, position of the first adjacent bits}). \quad (A)$$

Thus, starting from bit position 1 in Table 1 and parsing the illustrative bit stream in accordance with the aforementioned structure expression produces:
00=(2, 1)
11=(2, 3)
00=(2, 5)
111=(3, 7)
00=(2, 10)

Another structure is the given by the equation (B):

$$[(\text{number of adjacent "0's", position of the first adjacent "0"}) (\text{number of adjacent "1's", position of the fires adjacent "1"})] \quad (B)$$

In bit terms, starting from bit position number 1 for the bit stream of Table 1 this translated to:
00=(2, 1) —a unique sequence of adjacent bits
11=(2, 3) —a unique sequence of adjacent bits
00=(2, 5) —not a unique adjacent bit sequence
111=(3, 7) —a unique sequence of adjacent bits
00=(2, 10) —not a unique sequence of adjacent bits Applying expression (2) to identify multiple keys from which a dictionary may be constructed from such bit position/unique adjacent bit analysis results in:
Key_1=[(2,1), (2,3)]
Key_2=[(2,5), (3,7)]
Key_3=[(2,10), ( )]

In turn, a Dictionary_0 may be defined directed to the unique "adjacent bits" given by equation (C) as follows:

$$\text{Dictionary\_0} = \{\text{Key\_1} = [(2,1),(2,3)]\text{Key\_2} = [(\ ),(3,7)]\} \quad (C)$$

After building the dictionary, that bits that were not part thereof (i.e., the adjacent bits that are not the "first" adjacent bits of "0" or "1", said another way, not a unique adjacent bit sequence) are defined as the "seed" data set. In this example, the seed=0000.

As noted above, the binary representation (i.e., String_Binary) is represented by rules and a seed such that String_Binary is equal to the rules that operate the seed, as represented in expression (1):

$$\text{String\_Binary} = \text{Rules} * \text{Seed}. \quad (1)$$

So, String_Binary=Rules*String_Binary_New. For illustration, the first String_Binary is designated as String_Binary_New such that expression (1) is:

$$\text{String\_Binary} = \text{Rules} * \text{String\_Binary\_New}.$$

In this way, for illustration purposes, the first String_Binary is designated as String_Binary_0 and the Rule that is associated therewith is Rule_0, and the associated seed that accompanies this String_Binary_0 is String_Binary_1, as shown in expression (2):

$$\text{String\_Binary\_0} = \text{Rule\_0} * \text{String\_Binary\_1}. \quad (2)$$

The String_Binary_1 bit string can then be expressed in a similar fashion and notation in expression (3):

$$\text{String\_Binary\_1} = \text{Rule\_1} * \text{String\_Binary\_2}. \quad (3)$$

More generally then as shown in expression (4):

$$\text{String\_Binary\_}i = \text{Rule})\_i * \text{String\_Binary\_}(i+1); \quad (4)$$

where the of String_Binary_i is greater than (>) String_Binary_(i+1).

Then, taking expression (3) and replacing it in expression (2) yields expression (5) as follows:

$$\text{String\_Binary\_0} = \text{Rule\_0} * \text{Rule\_1} * \text{String\_Binary\_2}. \quad (5)$$

Recursively performing this for each expression yields expression (6) as follows:

$$\text{String\_Binary\_0} = \text{Rule\_0} * \text{Rule\_1} * \text{Rule\_2} * \ldots \text{Rule\_}N * \text{String\_Binary\_}(N+1); \quad (6)$$

where String_Binary_0 >> String_Binary N.

The final resulting encoded output (e.g., a compressed file) for the lossless compression operations of FIG. 1 can be expressed in expression (7) as follows:

$$\text{Rule\_0} * \text{Rule\_1} * \text{Rule\_2} * \ldots \text{Rule\_}N * \text{String\_Binary\_}(N+1); \quad (7)$$

where the size of String_Binary_0>> to the size of Rule_0*Rule_1*Rule_2* . . . Rule_N*String_Binary_(N+1).

In this way, by and through steps 110, 112, 114, 116, 118 and 120, recursively traversing the plurality of bits of the bit string (at step 110) as a function of the bit position designated for each respective bit of the plurality of bits and identifying one or more sets of uniquely adjacent bits and defining a rule (Rule_N) therefrom, defining a seed (String_Binary_N+1) from the balance of the non-uniquely adjacent Bits (at step 112), and storing (at step 114) the Rule_N and Seed (String_Binary_N+1). Determining (at step 116) whether the compression cycle is to continue (e.g., in accordance with a defined compression cycle using, for example, a compression ratio, threshold or sensitivity designation) and if so, increasing N by one (at step 118) and equating a new bit string to the most recently defined seed (at step 120) for further recursive processing. One illustrative compression cycle may be to continue the compression until exhausting the number of bits in the input stream and the identification of the uniquely adjacent bit sets. If the compression is completed (e.g., in accordance with a defined compression cycle using, for example, a compression ratio, threshold or sensitivity designation), at step 120, outputting a compressed file, at step 122, comprising a plurality of rules (Rule_0 . . . Rule_N) and the final seed defined (String_Binary_N+1) from the plurality of seeds defined. In this way, the compression steps operate on the initial binary representation of the input digital data stream by representing the digital data stream using two data sets namely a rule data set and a seed data set, wherein the rules data is a dictionary, and the seed data is a unique binary string (i.e., String_Binary) having a size that is less than the original data string.

Figure 2:
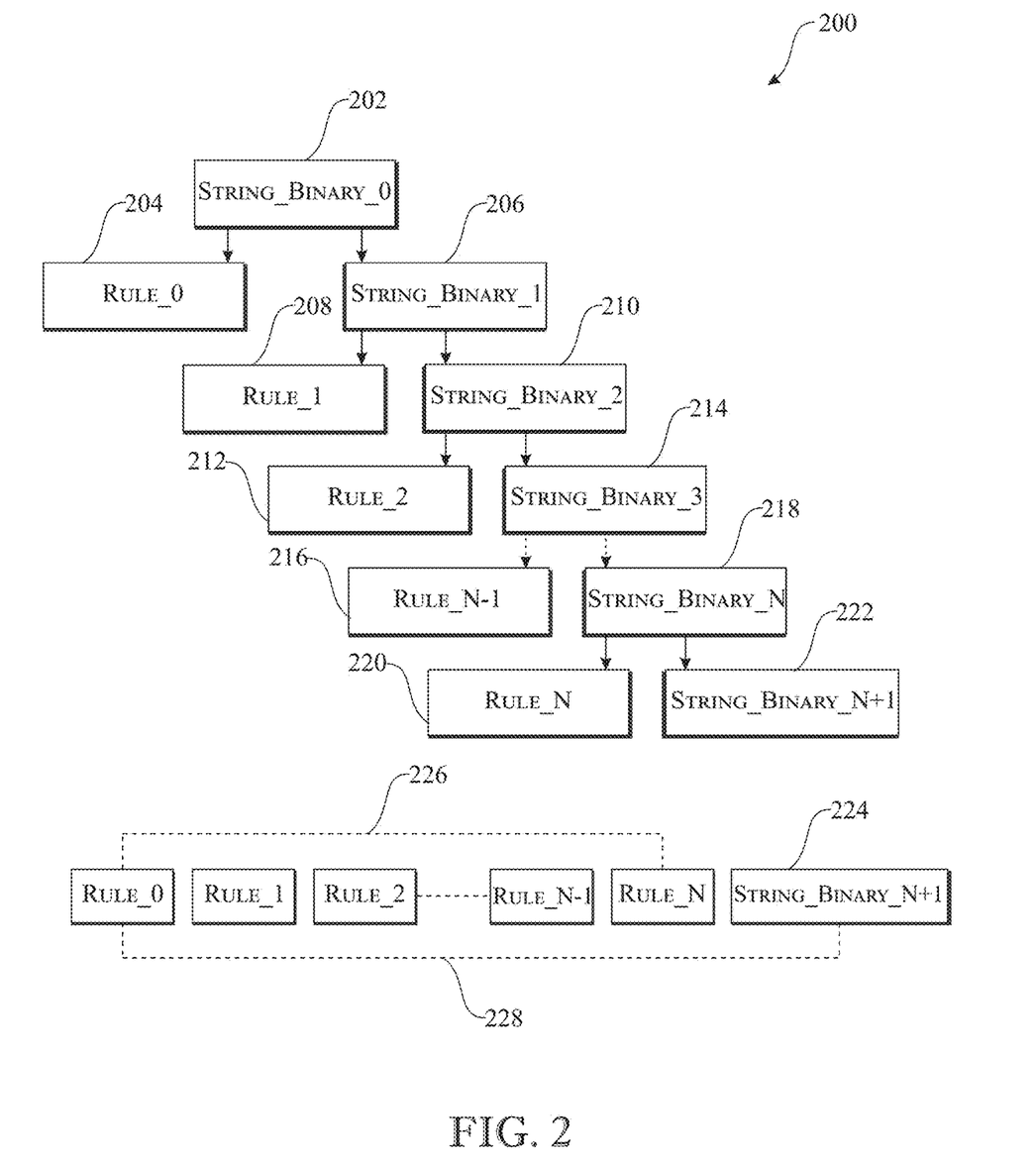
FIG. 2 presents a block diagram showing an illustrative input data stream undergoing the compression process pursuant to the illustrative operations of FIG. 1 in accordance with an embodiment.

To further illustrative the above encoding operations, FIG. 2 presents a block diagram 200 showing an illustrative input data stream undergoing the compression process pursuant to the illustrative operations of FIG. 1 in accordance with an embodiment. In particular, String_Binary_0 202 is the initial bit/binary representation of the to-be-compressed digital data stream as received. In accordance with the encoding operations as detailed above, the recursive processing on the bit stream using the two data sets (i.e., rules and seeds) results in the generation of a plurality of rules (i.e., Rule_0 204, Rule_1 208, Rule_2 212, Rule N−1 216, and Rule N 220) and a plurality of seeds (String_Binary_1 206, String_Binary_2 210, String_Binary_3 214, String_Binary_N 218, and String_Binary_N+1 222). In accordance with the principles of the disclosed embodiments, and as detailed above with the respect to the encoding operations thereof, the resulting final encoded output 228 comprising the plurality of rules 226 (i.e., Rule_0 204, Rule_1 208, Rule_2 212, Rule N−1 216, and Rule N 220) and the associated last generated seed 224 (i.e., String_Binary_N+1 220). The final encoded/compressed output 228 is then transmitted, for example, across a communications medium for decoding/decompression at the receiving end as will now be further discussed.

Figure 3:
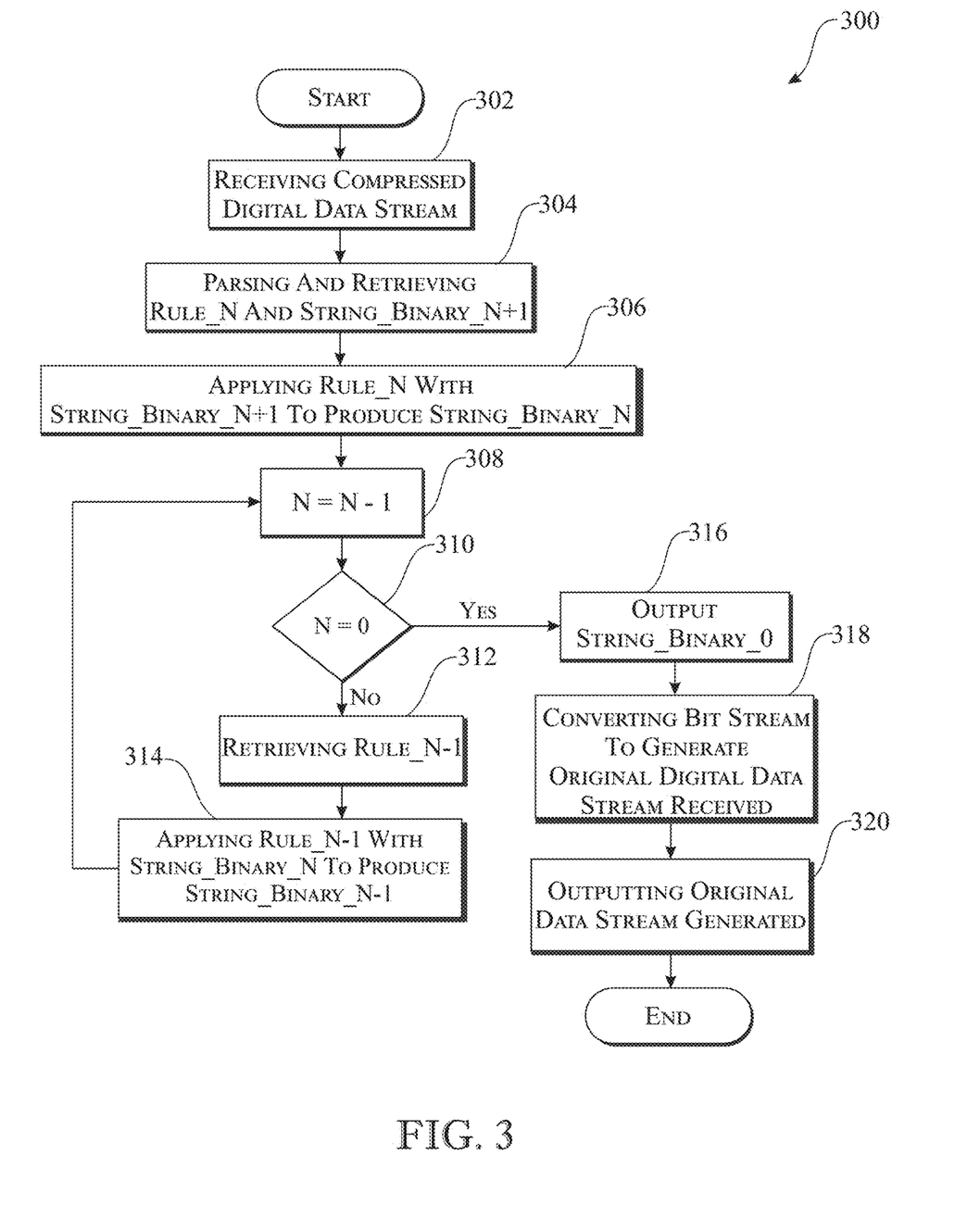
FIG. 3 presents a flowchart of illustrative operations for decompressing data in accordance with an embodiment.

Turning our attention to FIG. 3, a flowchart of illustrative operations 300 is shown for lossless data decompression employing seed bits and recursive processing in accordance with an embodiment. More particularly, at step 302, receiving a compressed digital data stream (e.g., the final encoded/compressed output 228) in accordance with the aforementioned compression operations. At step 304, parsing and retrieving Rule_N (i.e., the final rule of a plurality of rules generated during the compression operations) and String_Binary_N+1 (i.e., the final seed string of a plurality of seed strings generated during the compression operations). At step 306, applying Rule_N with String_Binary N+1 to produce String_Binary_N. Then, at steps 308, 310, 312, and 314, recursively applying Rule_N−1 with String_Binary_N to produce String_Binary_N−1 and outputting output String_Binary_0 (i.e., the initial binary string) until the end of the decompression cycle (i.e., when N=0 as determined at step 310). At step 316, outputting the decompressed/recovered String_Binary_0 and, at step 318, converting the bit stream to generate the original digital data stream received. At step 320, outputting the original digital data stream. In this way, the encoding/compression operate on the initial binary representation of the input digital data stream by representing the digital data stream using two data sets namely a rule data set and a seed data set, wherein the rules data is a dictionary and the seed data is a unique binary string (i.e., String_Binary) having a size that is less than the original data string, and decoding/decompression steps use the rules data and the unique binary string (operating on the transmitted compressed data file) to decompress and recover the original digital data stream. In another aspect of the embodiments herein, the input digital data stream size may be any size and the resultant compression thereof is in a range greater than or equal to seventy-five percent (75%) and less than one hundred percent (100%) with no (or minimal) data loss. In an embodiment, the input digital data stream is equal to or less than one (1) terabyte.

Figure 4:
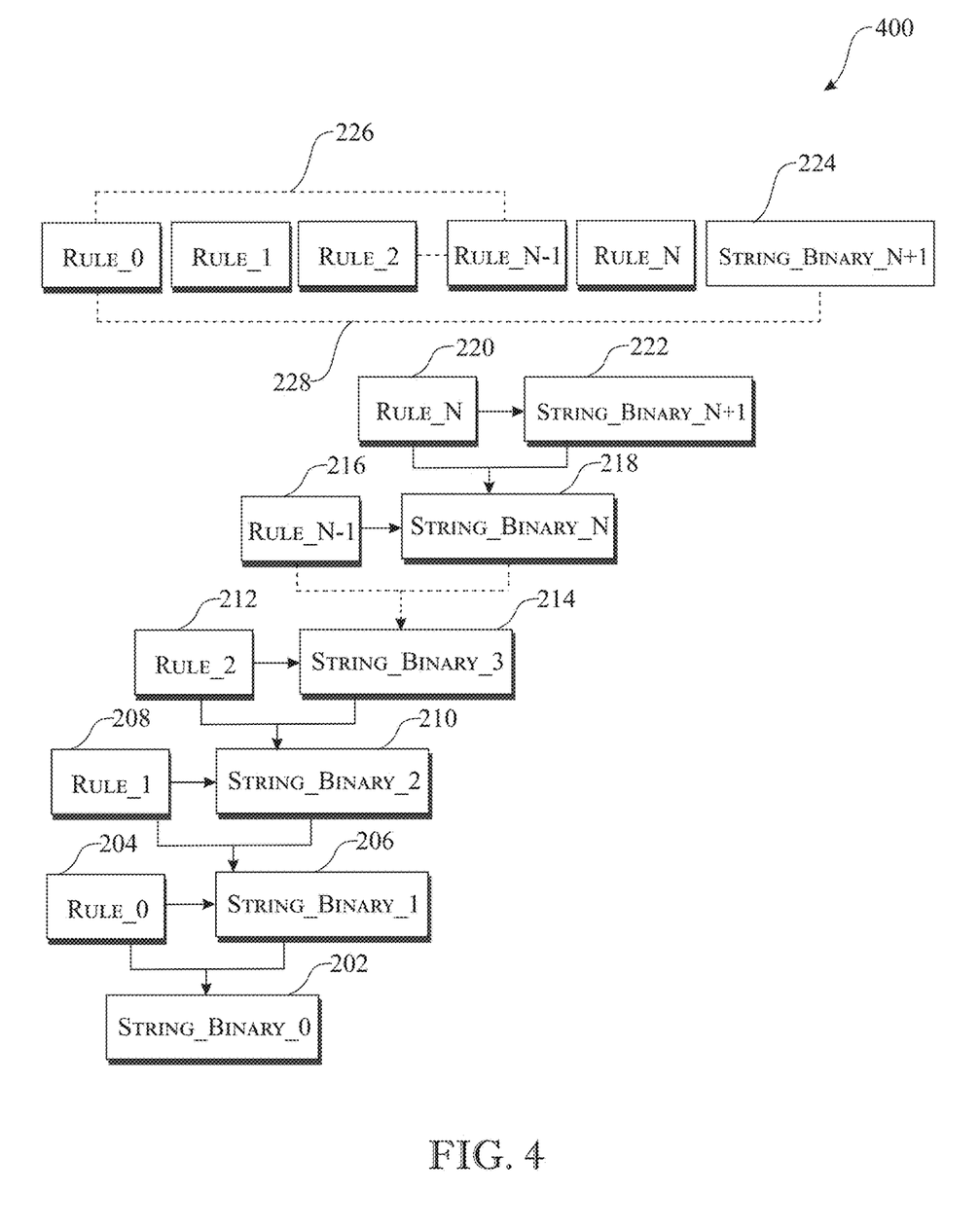
FIG. 4 presents a block diagram showing an illustrative input data stream undergoing the decompression process pursuant to the illustrative operations of FIG. 3 in accordance with an embodiment.

FIG. 4 presents a block diagram 400 showing an illustrative input data stream undergoing the decompression process pursuant to the illustrative operations of FIG. 3 in accordance with an embodiment. In particular, the final encoded output 228 comprising the plurality of rules 226 (i.e., Rule_0 204, Rule_1 208, Rule_2 212, Rule N−1 216, and Rule N 220) and the associated last generated seed 224 (i.e., String_Binary_N+1 222) is received (as transmitted from above-detailed compression operations). As shown, String_Binary_N+1 202 is the initial bit/binary representation of the compressed digital data stream to start the decompression in combination with the associated Rule_N 220. In accordance with the decoding operations as detailed above, the recursive processing on the received compressed bit stream using the two data sets (i.e., rules and seeds) results in the use of the following rule-seed combinations: Rule N−1 216 with the String_Binary_N 218, Rule_2 212 with the String_Binary_3 214, Rule_1 208 with the String_Binary_2 210, Rule_0 204 with the String_Binary_1 206). Thus, in accordance with the principles of the disclosed embodiments, the original input data stream is reconstructed using a seed and a plurality of associated rules. As shown in FIG. 4, the resulting final decoded/decompressed output comprises the original String_Binary_0 of the original input data stream.

Further, for example, from equation (C) hereinabove it is known that:
00=(2, 1)
11=(2, 3)
111=(3, 7); thereby resulting in the deconstructed string as follow:

|  | Designated Bit Position | | | | | | | | | | |
| --- | --- | --- | --- | --- | --- | --- | --- | --- | --- | --- | --- |
|  | 1 | 2 | 3 | 4 | 5 | 6 | 7 | 8 | 9 | 10 | 11 |
| Bit Stream (String_Binary) | 0 | 0 | 1 | 1 |  |  | 1 | 1 | 1 |  |  |

Further, applying the known seed (i.e., 0000) in combination with the associated Rule completes the operations resulting in the final decompressed output of:

|  | Designated Bit Position | | | | | | | | | | |
| --- | --- | --- | --- | --- | --- | --- | --- | --- | --- | --- | --- |
|  | 1 | 2 | 3 | 4 | 5 | 6 | 7 | 8 | 9 | 10 | 11 |
| Bit Stream (String_Binary) | 0 | 0 | 1 | 1 | 0 | 0 | 1 | 1 | 1 | 0 | 0 |

In some embodiments the method or methods described above may be executed or carried out by a computing system including an non-transitory computer medium and/or a tangible computer-readable storage medium, also described herein as a storage machine, which holds machine-readable instructions executable by a logic machine (i.e., a processor or programmable control device) to provide, implement, perform, and/or enact the above described methods, processes and/or tasks. When such methods and processes are implemented, the state of the storage machine may be changed to hold different data. For example, the storage machine may include memory devices such as various hard disk drives, CD, or DVD devices. The logic machine may execute machine-readable instructions via one or more physical information and/or logic processing devices. For example, the logic machine may be configured to execute instructions to perform tasks for a computer program. The logic machine may include one or more processors to execute the machine-readable instructions. The computing system may include a display subsystem to display a graphical user interface (GUI), or any visual element of the methods or processes described above. For example, the display subsystem, storage machine, and logic machine may be integrated such that the above method may be executed while visual elements of the disclosed system and/or method are displayed on a display screen for user consumption. The computing system may include an input subsystem that receives user input. The input subsystem may be configured to connect to and receive input from devices such as a mouse, keyboard, or gaming controller. For example, a user input may indicate a request that certain task is to be executed by the computing system, such as requesting the computing system to display any of the above described information or requesting that the user input updates or modifies existing stored information for processing. A communication subsystem may allow the methods described above to be executed or provided over a computer network. For example, the communication subsystem may be configured to enable the computing system to communicate with a plurality of personal computing devices. The communication subsystem may include wired and/or wireless communication devices to facilitate networked communication. The described methods or processes may be executed, provided, or implemented for a user or one or more computing devices via a computer-program product such as via an application programming interface (API).

Figure 5:
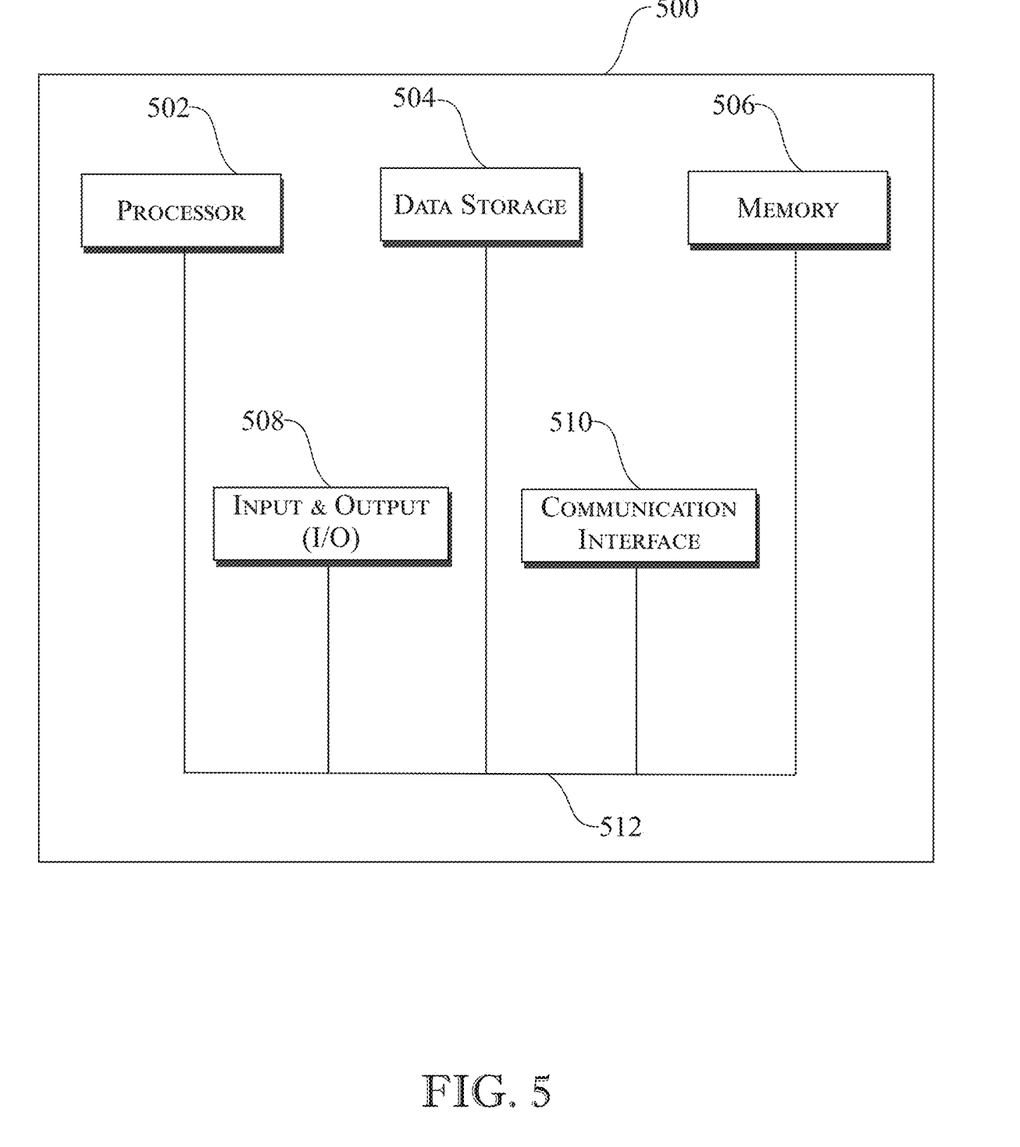
FIG. 5 presents a high-level block diagram of an exemplary computer for executing the data compression and/or data decompression operations herein in accordance with an embodiment.

For example, FIG. 5 is a high-level block diagram of an exemplary computer 500 that may be used for implementing the lossless data compression and decompression technique employing seed bits and recursive processing in accordance with the various embodiments herein. For example, the computer 500 may execute a software encoder and/or decoder in accordance with the principles of the embodiments. Computer 500 comprises a processor 502 operatively coupled to a data storage device 504 and a memory 506. Processor 502 controls the overall operation of computer 500 by executing computer program instructions that define such operations. Communications bus 512 facilitates the coupling and communication between the various components of computer 500. The computer program instructions may be stored in data storage device 504, or a non-transitory computer readable medium, and loaded into memory 506 when execution of the computer program instructions is desired.

Thus, the steps of the disclosed method (see, e.g., FIGS. 1 and 3) and the associated discussion herein above can be defined by the computer program instructions stored in memory 506 and/or data storage device 504 and controlled by processor 502 executing the computer program instructions. For example, the computer program instructions can be implemented as computer executable code programmed by one skilled in the art to perform the illustrative operations defined by the disclosed methods. Further, it will be appreciated that any flowcharts, flow diagrams, state transition diagrams, pseudo code, program code and the like represent various processes which may be substantially represented in computer readable medium and so executed by a computer, machine, or processor, whether or not such computer, machine or processor is explicitly shown. One skilled in the art will recognize that an implementation of an actual computer or computer system may have other structures and may contain other components as well, and that a high level representation of some of the components of such a computer is for illustrative purposes.

Accordingly, by executing the computer program instructions, processor 502 executes an algorithm defined by the disclosed method. Computer 500 also includes one or more communications interface 510 for communicating with other devices via a network (e.g., a wireless communications network) or communications protocol (e.g., Bluetooth®). For example, such communication interfaces may be a receiver, transceiver, or modem for exchanging wired or wireless communications in any number of well-known fashions. Computer 500 also includes one or more input/output devices 508 that enable user interaction with computer 500 (e.g., camera, display, keyboard, mouse, speakers, microphone, buttons, etc.).

Those skilled in the art will readily appreciate that stored computer instructions and/or systems configurations may be configured in any way while still accomplishing the various goals, features, and advantages according to the present disclosure. The terms "program," "application," "software application," and the like as used herein, are defined as a sequence of instructions designed for execution on a computer system. A "program," "computer program," "application," or "software application" may include a subroutine, a function, a procedure, an object method, an object implementation, an executable application, an applet, a servlet, a source code, an object code, a shared library/dynamic load library, and/or other sequence of instructions designed for execution on a computer system.

Processor 502 may include both general and special purpose microprocessors and may be the sole processor or one of multiple processors of computer 500. Processor 502 may comprise one or more central processing units (CPUs), for example. Processor 502, data storage device 504, and/or memory 506 may include, be supplemented by, or incorporated in, one or more application-specific integrated circuits (ASICs) and/or one or more field programmable gate arrays (FPGAs).

Data storage device 504 and memory 506 each comprise a non-transitory computer readable storage medium. Data storage device 504, and memory 506, may each include high-speed random access memory, such as dynamic random access memory (DRAM), static random access memory (SRAM), double data rate synchronous dynamic random access memory (DDR RAM), or other random access solid state memory devices, and may include non-volatile memory, such as one or more magnetic disk storage devices such as internal hard disks and removable disks, magneto-optical disk storage devices, optical disk storage devices, flash memory devices, semiconductor memory devices, such as erasable programmable read-only memory (EPROM), electrically erasable programmable read-only memory (EEPROM), compact disc read-only memory (CD-ROM), digital versatile disc read-only memory (DVD-ROM) disks, or other non-volatile solid state storage devices.

Input/output devices 508 may include peripherals, such as a camera, printer, scanner, display screen, etc. For example, input/output devices 508 may include a display device such as a cathode ray tube (CRT), plasma or liquid crystal display (LCD) monitor for displaying information to the user, a keyboard, and a pointing device such as a mouse or a trackball by which the user can provide input to computer 500.

Since many modifications, variations, and changes in detail can be made to the described preferred embodiments of the invention, it is intended that all matters in the foregoing description and shown in the accompanying drawings be interpreted as illustrative and not in a limiting sense. Furthermore, it is understood that any of the features presented in the embodiments may be integrated into any of the other embodiments unless explicitly stated otherwise. Thus, the scope of the invention should be determined by the appended claims and their legal equivalents.

What is claimed is:

1. A method comprising:
   receiving a data stream;
   producing an initial binary bit string from the data stream received, the initial binary bit stream produced comprising a plurality of bits;
   designating a respective bit position of a plurality of bit positions for each respective bit of the plurality of bits of the initial binary bit string produced;
   identifying, from the initial binary bit string produced, one or more sets of uniquely adjacent bits therein and defining a first rule of a plurality of rules therefrom, the first rule defined comprising at least a number of the uniquely adjacent bits of the one or more sets of uniquely adjacent bits identified and the respective bit position of a first one adjacent bit of the number of the uniquely adjacent bits;
   defining a first seed string of a plurality of seed strings from a balance of non-uniquely adjacent bits of the initial binary bit string remaining after the identifying one or more sets of uniquely adjacent bits therein and associating and storing the first seed string defined with the first rule defined;
   defining a new binary bit string as the first seed string defined;
   in accordance with a compression cycle, performing the steps of:
   (a) using the new bit string defined, identifying one or more sets of uniquely adjacent bits therein and defining a next one rule of the plurality of rules therefrom, the next one rule defined comprising at least a number of the uniquely adjacent bits of the one or more sets of uniquely adjacent bits identified and the respective bit position of a first one adjacent bit of the number of the uniquely adjacent bits;
   (b) defining a next one seed string in the plurality of seed strings from a balance of non-uniquely adjacent bits of the new binary bit string remaining after the identifying one or more sets of uniquely adjacent bits therein and associating and storing the next one seed string defined with the next one rule defined; and
   (c) determining if the compression cycle has been satisfied and if not, then redefining the new bit string as the next one seed string defined and repeating steps (a) and (b), and if so, then specifying a final seed string as a last one of the next one seed strings defined in the plurality of seed strings and specifying a final rule as a last one of the next one rules defined in the plurality of rules; and
   outputting a compressed digital data stream comprising the final seed string specified as a last one of the next one seed strings defined in the plurality of seed strings in combination with the plurality of rules defined.

2. The method of claim 1, wherein the data stream received is a digital stream comprising a digital format associated with at least one of: still image files, audio files, digital video data, motion picture files, geospatial data, qualitative data, digital binary data (BD), a six (6) degrees of freedom digital model, digital Internet-of-Things (IoT), documentation and scripts, chemistry data, quantitative tabular data with metadata, video data streams, an audio data streams, and a textual data streams.

3. The method of claim 2, wherein the compression cycle is defined using one of a compression ratio, a threshold, and a sensitivity designation.

4. The method of claim 1, wherein the initial bit string produced and each of the new bit strings defined are represented by a data structure comprising a respective one rule of the plurality of rules in combination with a respective one seed string of the plurality of seed strings.

5. The method of claim 4, wherein the plurality of rules serve as a dictionary comprising a set of strings in the data structure, and each seed string of the plurality of seed strings is a unique binary bit string having a size that is less than the initial binary bit string produced.

6. The method of claim 5, wherein the data structure comprises a form defined as a function of a number of equal adjacent bits and a position of first adjacent bits.

7. The method of claim 1, wherein the data stream received is subject to a resultant compression in a range greater than or equal to seventy-five percent (75%) and less than one hundred percent (100%) in accordance with the compressed digital data stream outputted.

8. The method of claim 1, wherein the data stream received is transmitted using a medium comprising one of a wired transmission medium, a wireless transmission medium and an optical transmission medium.

9. The method of claim 1, wherein the data stream received is of a variable size.

10. The method of claim 1, wherein the data stream received is equal to one (1) terabyte of data.

11. The method of claim 1, wherein the method further comprises:
    receiving the compressed digital data stream outputted;
    parsing the compressed digital data stream received for retrieving the plurality of rules and the plurality of seed strings therefrom;
    recovering the initial binary bit string by recursively, in accordance with a decompression cycle, applying each rule of the plurality of rules retrieved, starting with the final rule specified of the next one rule of the plurality of rules together with the associated seed string of the plurality of seed strings therefore; and converting the initial binary bit string recovered for generating the data stream received therefrom.

12. A method comprising:

receiving a data stream;

producing an initial binary bit string from the data stream received, the initial binary bit stream produced comprising a plurality of bits;

designating a respective bit position of a plurality of bit positions for each respective bit of the plurality of bits of the initial binary bit string produced;

identifying, from the initial binary bit string produced, one or more sets of uniquely adjacent bits therein and defining a first rule of a plurality of rules therefrom, the first rule defined comprising at least a number of the uniquely adjacent bits of the one or more sets of uniquely adjacent bits identified therein and the respective bit position of a first one adjacent bit of the number of the uniquely adjacent bits;

defining a first seed string of a plurality of seed strings from a balance of non-uniquely adjacent bits of the initial binary bit string remaining after the identifying one or more sets of uniquely adjacent bits therein and associating and storing the first seed string defined with the first rule defined;

defining a new binary bit string as the first seed string defined;

in accordance with a compression cycle, performing the steps of:

(a) using the new bit string defined, identifying one or more sets of uniquely adjacent bits therein and defining a next one rule of the plurality of rules therefrom, the next one rule defined comprising at least a number of the uniquely adjacent bits of the one or more sets of uniquely adjacent bits identified and the respective bit position of a first one adjacent bit of the number of the uniquely adjacent bits;

(b) defining a next one seed string in the plurality of seed strings from a balance of non-uniquely adjacent bits of the new binary bit string remaining after the identifying one or more sets of uniquely adjacent bits therein and associating and storing the next one seed string defined with the next one rule defined; and (c) determining if the compression cycle has been satisfied and if not, then redefining the new bit string as the next one seed string defined and repeating steps (a) and (b), and if so, then specifying a final seed string as a last one of the next one seed strings defined in the plurality of seed strings and specifying a final rule as a last one of the next one rules defined in the plurality of rules;

outputting a compressed digital data stream comprising the final seed string specified as a last one of the next one seed strings defined in the plurality of seed strings in combination with the plurality of rules defined; and wherein the initial bit string produced and each of the new bit strings defined are represented by a data structure comprising a respective one rule of the plurality of rules in combination with a respective one seed string of the plurality of seed strings, and the plurality of rules serve as a dictionary comprising a set of strings in the data structure, and each seed string of the plurality of seed strings is a unique binary bit string having a size that is less than the initial binary bit string produced.

13. The method of claim 12, wherein the data stream received is a digital stream comprising a digital format associated with at least one of: still image files, audio files, digital video data, motion picture files, geospatial data, qualitative data, digital binary data (BD), a six (6) degrees of freedom digital model, digital Internet-of-Things (IoT), documentation and scripts, chemistry data, quantitative tabular data with metadata, video data streams, an audio data streams, and a textual data streams.

14. The method of claim 12, wherein the compression cycle is defined using one of a compression ratio, a threshold, and a sensitivity designation.

15. The method of claim 12, wherein the method further comprises:

receiving the compressed digital data stream outputted;

parsing the compressed digital data stream received for retrieving the plurality of rules and the plurality of seed strings therefrom;

recovering the initial binary bit string by recursively, in accordance with a decompression cycle, applying each rule of the plurality of rules retrieved, starting with the final rule specified of the next one rule of the plurality of rules together with the associated seed string of the plurality of seed strings therefore; and converting the initial binary bit string recovered for generating the data stream received therefrom.

16. The method of claim 12, wherein the data structure comprises a form defined as a function of a number of equal adjacent bits and a position of first adjacent bits.

17. A non-transitory computer medium having executable code stored thereon, that when executed, cause a computing device to perform operations comprising:

receiving a data stream;

producing an initial binary bit string from the data stream received, the initial binary bit stream produced comprising a plurality of bits;

designating a respective bit position of a plurality of bit positions for each respective bit of the plurality of bits of the initial binary bit string produced;

identifying, from the initial binary bit string produced, one or more sets of uniquely adjacent bits therein and defining a first rule of a plurality of rules therefrom, the first rule defined comprising at least a number of the uniquely adjacent bits of the one or more sets of uniquely adjacent bits identified therein and the respective bit position of a first one adjacent bit of the number of the uniquely adjacent bits;

defining a first seed string of a plurality of seed strings from a balance of non-uniquely adjacent bits of the initial binary bit string remaining after the identifying one or more sets of uniquely adjacent bits and associating and storing the first seed string defined with the first rule defined;

defining a new binary bit string as the first seed string defined;

in accordance with a compression cycle, performing the steps of:

(a) using the new bit string defined, identifying one or more sets of uniquely adjacent bits therein and defining a next one rule of the plurality of rules therefrom, the next one rule defined comprising at least a number of the uniquely adjacent bits of the one or more sets of uniquely adjacent bits identified and the respective bit position of a first one adjacent bit of the number of the uniquely adjacent bits;

(b) defining a next one seed string in the plurality of seed strings from a balance of non-uniquely adjacent bits of the new binary bit string remaining after the identifying one or more sets of uniquely adjacent bits therein and associating and storing the next one seed string defined with the next one rule defined; and (c) determining if the compression cycle has been satisfied and if not, then redefining the new bit string as the next one seed string defined and repeating steps (a) and (b), and if so, then specifying a final seed string as a last one of the next one seed strings defined in the plurality of seed strings and specifying a final rule as a last one of the next one rules defined in the plurality of rules; and outputting a compressed digital data stream comprising the final seed string specified as a last one of the next one seed strings defined in the plurality of seed strings in combination with the plurality of rules defined.

18. The non-transitory computer medium of claim 17, wherein the initial bit string produced and each of the new bit strings defined are represented by a data structure comprising a respective one rule of the plurality of rules in combination with a respective one seed string of the plurality of seed strings, and the plurality of rules serve as a dictionary comprising a set of strings in the data structure, and each seed string of the plurality of seed strings is a unique binary bit string having a size that is less than the initial binary bit string.

19. The non-transitory computer medium of claim 18, wherein the data structure comprises a form defined as a function of a number of equal adjacent bits and a position of first adjacent bits.

20. The non-transitory computer medium of claim 17, wherein the non-transitory computer medium further comprises:

receiving the compressed digital data stream outputted;

parsing the compressed digital data stream received for retrieving the plurality of rules and the plurality of seed strings therefrom;

recovering the initial binary bit string by recursively, in accordance with a decompression cycle, applying each rule of the plurality of rules retrieved, starting with the final rule specified of the next one rule of the plurality of rules together with the associated seed string of the plurality of seed strings therefore; and converting the initial binary bit string recovered for generating the data stream received therefrom.

\* \* \* \* \*